United States Patent [19]
Löwel

[11] Patent Number: 4,868,909
[45] Date of Patent: Sep. 19, 1989

[54] SIGNAL SHAPING CIRCUIT UTILIZING A MAGNETO-RESISTOR IN A VOLTAGE DIVIDER CIRCUIT

[75] Inventor: Helmut Löwel, Nürnberg, Fed. Rep. of Germany

[73] Assignee: Standard Elektrik Lorenz Aktiengesellschaft, Stuttgart, Fed. Rep. of Germany

[21] Appl. No.: 162,224

[22] Filed: Feb. 29, 1988

[30] Foreign Application Priority Data

Feb. 27, 1987 [DE] Fed. Rep. of Germany ....... 3706306

[51] Int. Cl.⁴ .................... G01N 27/72; G01B 7/14; H01L 43/08; H03K 17/14
[52] U.S. Cl. .................... 324/225; 324/208; 324/252; 307/309; 338/32 R
[58] Field of Search .............. 324/207, 208, 224, 225, 324/251, 252; 307/309; 338/32 R, 324

[56] References Cited

U.S. PATENT DOCUMENTS 3,846,697 11/1974 Cila et al. ........................... 324/208

OTHER PUBLICATIONS

Dipl.-Phys. August Petersen "Magnetoresistive Sensoren IM Kfz." Elektronik 10/17.5 1985, pp. 99 to 101.

Primary Examiner—Reinhard J. Eisenzopf
Assistant Examiner—Walter E. Snow
Attorney, Agent, or Firm—Spencer & Frank

[57] ABSTRACT

A circuit for deriving a temperature-independent square-wave signal from a measurement signal which consists of a DC component and an AC component and which is taken across a magneto-resistor exposed to an alternating magnetic field. The circuit has a controllable impedance, a timing section with a relatively long time constant, and operational amplifiers with FET inputs.

7 Claims, 2 Drawing Sheets

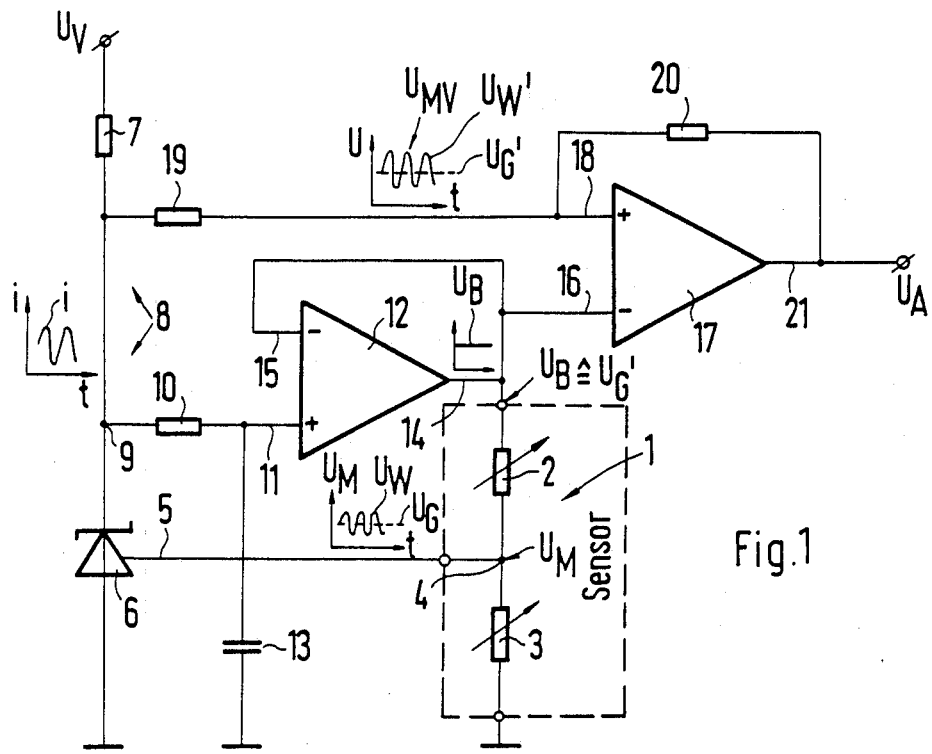
Fig. 1
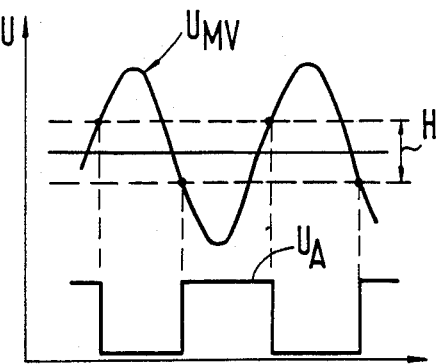
Fig. 2
Fig. 3

… …

SIGNAL SHAPING CIRCUIT UTILIZING A MAGNETO-RESISTOR IN A VOLTAGE DIVIDER CIRCUIT

CROSS REFERENCE TO RELATED APPLICATION

This Application claims the priority of Federal Republic of Germany Patent Application No. P 37 06 306.5, filed Feb. 27th, 1987.

BACKGROUND OF THE INVENTION

The present invention relates to a circuit for deriving a temperature-independent square-wave signal from a measurement signal which consists of a DC component and an AC component and which is taken across a magneto-resistor exposed to an alternative magnetic field.

A circuit with a bridge circuit consisting of four magneto-resistors is described in "Elektronik", No. 10, May 17th, 1985, pp. 99 to 101, where on p. 100 an operational amplifier is used as a signal amplifier, and a Schmitt-trigger-connected operational amplifier as a pulse shaper. The supply voltage is assumed to be constant, and temperature compensation is effected by a PTC resistor via an additional amplifier and a voltage divider. Each of the leads to the signal amplifier contains a resistor for eliminating any temperature dependence of the gain. The prior art circuit requires at least four terminal leads, namely two for the supply voltage and two for the output signal.

SUMMARY OF THE INVENTION

It is an object of the present invention to reduce the complexity of such a prior art circuit and nevertheless to obtain high sensitivity and a stabilized output.

According to the present invention, this objection is attained by converting a measurement signal into a correspondingly time-varying current in the second voltage divider, and by using the shift in potential at the tap of the second voltage divider to stabilize the operating voltage of the first voltage divider and to produce a square-wave signal. Thus, only few components are necessary. They can be combined into a structural unit. Besides the ground connection, only two leads are required, namely, an input lead for the supply voltage and an output lead for the output signal.

Further advantageous details of the invention will become apparent from the following description of an embodiment of the invention taken in conjunction with the accompanying drawing.

BRIEF DESCRIPTION OF THE DRAWINGS

FIG. 1 shows a circuit diagram with two magneto-resistors;

FIG. 2 shows one possibility of positioning the two magneto-resistors relative to each other and to a tooth system, and FIG. 3 shows the waveforms of the amplified measurement voltage and the output signal derived therefrom.

BRIEF DESCRIPTION OF THE PREFERRED EMBODIMENTS

Figure 4:
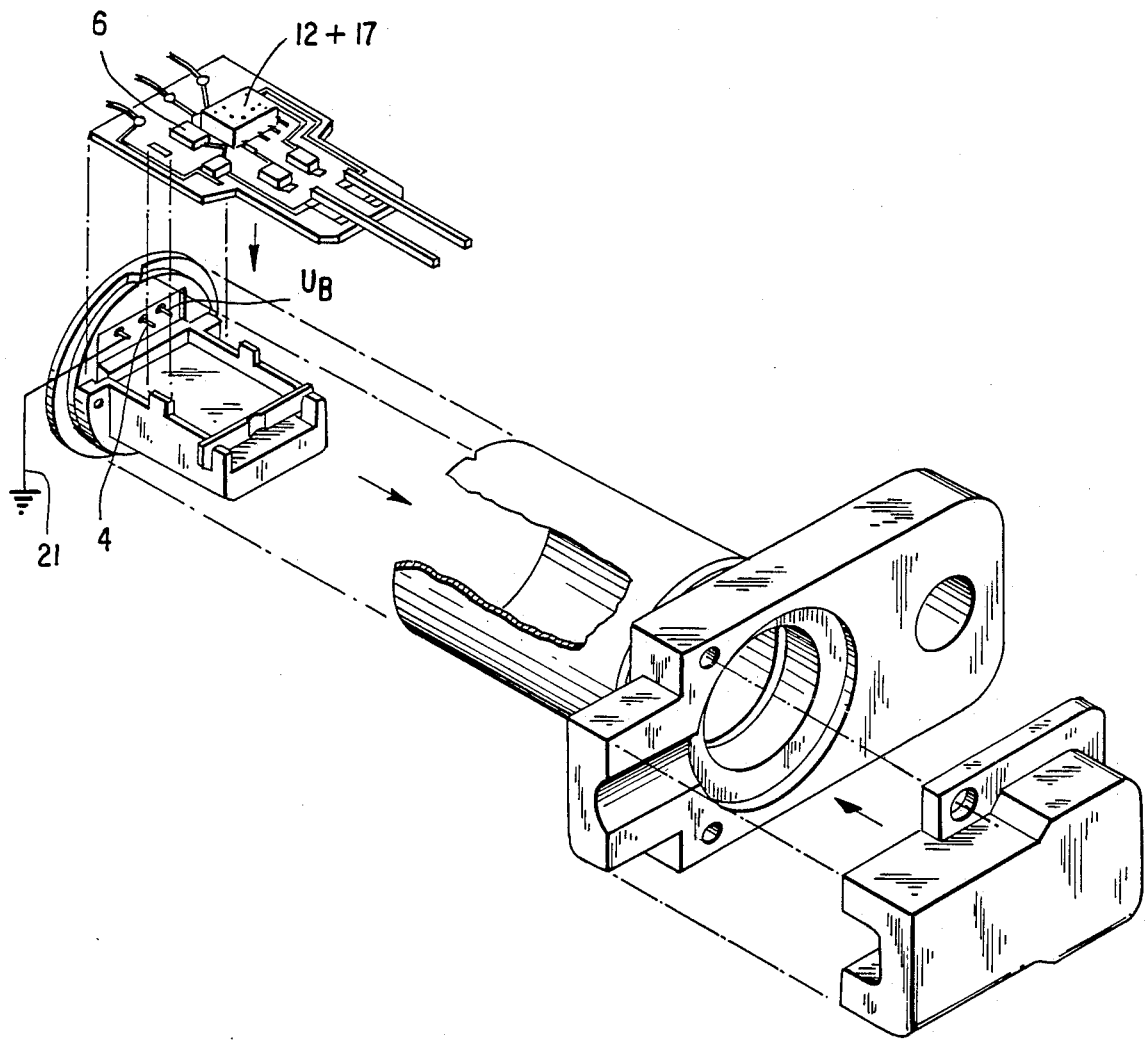
FIG. 4 illustrates the circuit of the present invention mounted as a small unitized single package for implementation on a conventional rotation sensor.

The reference numeral 1 denotes a first voltage divider consisting of a magneto-resistor 2 in series with another magneto-resistor 3 or a normal resistor. One end of the voltage divider is grounded. The tap 4 of the first voltage divider 1 is connected to a control electrode 5 of a controllable zener diode 6, which is used as a temperaturecompensated controllable impedance and has its anode grounded. In practice, the diode may be a type TL 431. The controllable zener diode 6 and a resistor 7 connected to the supply voltage $U_V$ form a second voltage divider 8. The tap 9 of the latter is connected via a resistor 10 to the positive input 11 of an operational amplifier 12 used as an impedance transformer. A capacitor 13 is connected from the input 11 to ground. This capacitor and the resistor 10 constitute an RC timing section whose time constant is chosen to be considerably longer than the longest period of the AC component $U_W$ of the measurement signal $U_M$ at the tap 4 of the first voltage divider 1. The operational amplifiers used have field-effect-transistor (FET) inputs, so that a very high input resistance is obtained. To achieve a long time constant of, e.g., one second, the capacitor 13 needs to have only a low value because the value of the resistor 10 can be very high.

The output 14 of the operational amplifier 12, which is used as an impedance transformer, is fed back to the negative input 15 of this operational amplifier, and connected to the negative input 16 of a second operational amplifier 17, which is used as a comparator. The stabilized potential at the output 14 of the operational amplifier 12 is the operating voltage $U_B$ for the first voltage divider 1.

The positive input 18 of the second operational amplifier 17 is connected to the tap 9 of the second voltage divider 8 via a resistor 19 and to the output 21 of the second operational amplifier 17 via a feedback resistor 20.

The operation of the circuit is as follows:

The two magneto-resistors 2 and 3 move relative to a ferromagnetic gear or rack whose teeth Z have a constant width and a suitable spacing. This is illustrated in the sketch of FIG. 2. The gear or rack is magnetized in a manner known per se, or the magneto-resistors 2 and 3 have a permanent magnet associated therewith whose magnetic field passes through the magneto-resistors, and the direction of this magnetic field in the magneto-resistors is changed by an internal ferromagnetic part, thereby changing the resistance values of the magneto-resistors. As the teeth Z move past the magneto-resistors 2, 3, which are displaced in relation to one another by a half the tooth width as illustrated in FIG. 2, the resistance value of one magneto-resistor increases, and that of the other decreases, periodically, and vice versa, from, e.g., the same standard value. Thus, a measurement signal $U_M$ consisting of a DC component $U_G$ and an alternating voltage $U_W$ superimposed thereon is obtained at the tap 4 of the voltage divider 1. This measurement signal is shown in FIG. 1 above the connection between the tap 4 and the control electrode 5.

As mentioned above, in a practical embodiment, the integrated circuit TL 431 with internal temperature compensation and a 2.5-V reference voltage can be used for the controllable zener diode 6. With magneto-resistors 2 and 3 of equal value, the operating voltage $U_B$ is therefore 5 V. In the operational condition, the control electrode 5 thus has the above-mentioned 2.5 V applied thereto.

If the resistance values of the magneto-resistors 2, 3 are changed by the motion of the teeth Z relative to the magneto-resistors, the measurement voltage $U_M$ will be generated. The latter controls the controllable zener diode 6 in such a way that the potential at the tap 9 of the second voltage divider 8 increases as the potential at the tap 4 of the first voltage divider 1 decreases, and vice versa.

Without the capacitor 13 and the resistor 10, this change would result in a change in the operating voltage $U_B$ so that the potential at the tap 4 of the first voltage divider 1 would assume the value 2.5 V. As the time constant of the RC section consisting of the capacitor 13 and the resistor 10 is longer than the period of the AC component $U_W$ of the measurement signal $U_M$, and because of the highimpedance inputs of the operational amplifiers 12 and 17, the result is a considerable change in the impedance of the controllable zener diode 6 and, consequently, a change in current through the second voltage divider 8 and a corresponding change in potential at the tap 9 of the second voltage divider 8, which can be taken off as an amplified measurement signal $U_{MV}$. Hence, the operating voltage $U_B$ remains constant, too, and it contains practically no AC components. The DC operating voltage $U_B$ is also applied to the negative input 16 of the operational amplifier used as a comparator, 17. Since the DC and AC components $U_W'$ and $U_G'$ are applied to the positive input 18 of this operational amplifier 17, the latter compares the measurement voltage $U_{MV}$ with the DC component $U_G'$. In accordance with the hysteresis H determined by the resistors 19 and 20, the operational amplifier 17 therefore switches to a negative level from a predetermined voltage value above the AC component, and to a positive level from a corresponding voltage value below the DC component. These states are shown schematically in FIG. 3.

Thanks to the above arrangement, there is generated a relatively exact, stable, particularly temperature-stabilized, square-wave output voltage UA. The use of operational amplifiers with FET inputs permits the capacitor to be kept very small because a very high-value resistor 10 of the order of, e.g., 10 megohms to a few megohms can be used. To implement a time constant of 1 second, a capacitor of, e.g., 100 nF can thus be used. This permits a very compact circuit design, and the entire circuit, including the sensor, the impedance transformer stage, the pulse shaper, etc., can be housed in a small package as illustrated in FIG. 4. Besides a ground contact 21, only two terminal leads 4 and $U_B$ are needed.

It will be understood that the above description of the present invention is susceptible to various modifications, changes and adaptations, and the same are intended to be comprehended within the meaning and range of equivalents of the appended claims.

What is claimed is:

1. A circuit for deriving a temperature-independent square-wave signal from a measurement signal which consists of a DC component and an AC component and which is taken across a magneto-resistor exposed to an alternating magnetic field, comprising a first voltage divider incorporating the magnetoresistor and a second resistor, said first voltage divider having a tap connected to the control input of a temperature-compensated controllable impedance, which together with a third resistor connected to a supply voltage forms a second voltage divider, said second voltage divider having a tap connected via a resistor of an RC timing section to the positive input of a first operational amplifier used as an impedance transformer and having field-effect-transistor inputs, the capacitor of said RC section being connected from said positive input to ground, with the potential at the output of said first operational amplifier forming the operating voltage of the first voltage divider, and means for applying said operating voltage both to the negative input of said first operational amplifier and to the negative input of a second operational amplifier used as a comparator, with the positive input of said second operational amplifier being connected t said tap of said second voltage divider via a fourth resistor and to the output of said second operational amplifier via a feedback resistor, and wherein the time constant of the RC section is considerably longer than the longest period of the AC component of the measurement signal.

2. A circuit as claimed in claim 1, wherein at least said magneto-resistor, said controllable impedance, said timing section, said impedance transformer, and said comparator are housed in a single package.

3. A circuit as claimed in claim 1, wherein said controllable impedance is a controllable zener diode.

4. A circuit as claimed in claim 3, wherein at least said magneto-resistor, said controllable impedance, said timing section, said impedance transformer, and said comparator are housed in a single package.

5. A circuit according to claim 1, wherein said second resistor includes a magneto-resistor.

6. A circuit according to claim 2, wherein said second resistor includes a magneto-resistor.

7. A circuit according to claim 3, wherein said second resistor includes a magneto-resistor.

* * * * *